(12) United States Patent
Togashi et al.

(10) Patent No.: US 11,251,373 B2
(45) Date of Patent: Feb. 15, 2022

(54) HIGH MOLECULAR WEIGHT COMPOUND CONTAINING SUBSTITUTED TRIARYLAMINE STRUCTURAL UNIT

(71) Applicant: HODOGAYA CHEMICAL CO., LTD., Tokyo (JP)

(72) Inventors: Kazunori Togashi, Tokyo (JP); Hideyoshi Kitahara, Tokyo (JP); Mari Kaneko, Tokyo (JP); Junichi Izumida, Tokyo (JP)

(73) Assignee: HODOGAYA CHEMICAL CO., LTD., Tokyo (JP)

( * ) Notice: Subject to any disclaimer, the term of this patent is extended or adjusted under 35 U.S.C. 154(b) by 155 days.

(21) Appl. No.: 16/349,919

(22) PCT Filed: Nov. 29, 2017

(86) PCT No.: PCT/JP2017/042809
§ 371 (c)(1),
(2) Date: May 14, 2019

(87) PCT Pub. No.: WO2018/101331
PCT Pub. Date: Jun. 7, 2018

(65) Prior Publication Data
US 2019/0326515 A1    Oct. 24, 2019

(30) Foreign Application Priority Data

Nov. 30, 2016  (JP) .............................. JP2016-232560

(51) Int. Cl.
*H01L 51/00* (2006.01)
*C08G 61/12* (2006.01)
(Continued)

(52) U.S. Cl.
CPC .......... *H01L 51/0039* (2013.01); *C08G 61/12* (2013.01); *C09K 11/06* (2013.01);
(Continued)

(58) Field of Classification Search
CPC ............. H01L 51/0039; H01L 51/0043; H01L 51/5012; H01L 51/5016; H01L 51/5056;
(Continued)

(56) References Cited

U.S. PATENT DOCUMENTS

2001/0026878 A1  10/2001  Woo et al.
2010/0276674 A1  11/2010  Conway et al.
(Continued)

FOREIGN PATENT DOCUMENTS

CN   101911334 A   12/2010
CN   102781906 A   11/2012
(Continued)

OTHER PUBLICATIONS

Huang et al., "Synthesis and Electroluminescent Properties of Polyfluorene-Based Conjugated Polymers Containing Bipolar Groups", Journal of Polymer Science: Part A: Polymer Chemistry, vol. 47, 2009, pp. 6231-6245.
(Continued)

*Primary Examiner* — Shane Fang
(74) *Attorney, Agent, or Firm* — Birch, Stewart, Kolasch & Birch, LLP

(57) ABSTRACT

A high molecular weight compound according to the present invention includes a substituted triarylamine structural unit represented by the following general formula (1),

[Chem. 1]

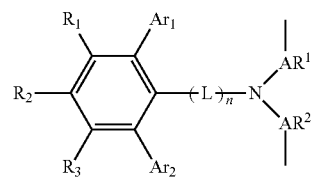

(Continued)

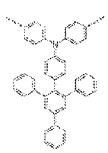

Structural Unit 1

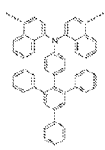

Structural Unit 2

Structural Unit 3 where $AR^1$, $AR^2$, and L each independently represent a divalent aromatic hydrocarbon group or a divalent aromatic heterocyclic group, n is an integer of 1 to 3, $Ar_1$ and $Ar_2$ each independently represent an aryl group or a heteroaryl group, and $R_1$, $R_2$, and $R_3$ each independently represent a hydrogen atom, a heavy hydrogen atom, a fluorine atom, a chlorine atom, a cyano group, a nitro group, an alkyl group having 1 to 6 carbon atoms, an alkyloxy group having 1 to 6 carbon atoms, a cycloalkyl group having 5 to 10 carbon atoms, a cycloalkyloxy group having 5 to 10 carbon atoms, an alkenyl group having 2 to 6 carbon atoms, an aryl group, an aryloxy group, or a heteroaryl group.

13 Claims, 21 Drawing Sheets

(51) Int. Cl.
  *C09K 11/06* (2006.01)
  *H01L 51/50* (2006.01)
(52) U.S. Cl.
  CPC .... *H01L 51/0043* (2013.01); *C08G 2261/124* (2013.01); *C08G 2261/148* (2013.01); *C08G 2261/1412* (2013.01); *C08G 2261/18* (2013.01); *C08G 2261/312* (2013.01); *C08G 2261/3142* (2013.01); *C08G 2261/3162* (2013.01); *C08G 2261/512* (2013.01); *C08G 2261/522* (2013.01); *C08G 2261/95* (2013.01); *C09K 2211/1416* (2013.01); *C09K 2211/1425* (2013.01); *C09K 2211/1433* (2013.01); *H01L 51/5012* (2013.01); *H01L 51/5016* (2013.01); *H01L 51/5056* (2013.01); *H01L 51/5088* (2013.01); *H01L 51/5096* (2013.01)
(58) Field of Classification Search
  CPC . H01L 51/5088; H01L 51/5096; C08G 61/12; C08G 2261/124; C08G 2261/1412; C08G 2261/148; C08G 2261/18; C08G 2261/312; C08G 2261/3142; C08G 2261/3162; C08G 2261/143; C08G 2261/411; C08G 2261/95; C08G 2261/1434; C08G 2261/512; C08G 2261/91; C08G 2261/522; C08G 2261/1416; C08G 2261/1425; C08G 2261/1433; C09K 11/06

See application file for complete search history.

(56) References Cited

U.S. PATENT DOCUMENTS

| | | |
|---|---|---|
| 2011/0042661 A1 | 2/2011 | Endo et al. |
| 2012/0181530 A1 | 7/2012 | Funyuu et al. |
| 2012/0292609 A1 | 11/2012 | Yokoyama |
| 2015/0069303 A1 | 3/2015 | Eckes et al. |
| 2015/0255724 A1 | 9/2015 | Pan |
| 2015/0270502 A1 | 9/2015 | Fuchiwaki et al. |
| 2016/0005972 A1 | 1/2016 | Otani |

FOREIGN PATENT DOCUMENTS

| | | |
|---|---|---|
| CN | 105009318 A | 10/2015 |
| EP | 3370272 A1 | 9/2018 |
| JP | 2005-272834 A | 10/2005 |
| JP | 2007-119763 A | 5/2007 |
| JP | 2007-162009 A | 6/2007 |
| JP | 2007-177225 A | 7/2007 |
| JP | 2009-287000 A | 12/2009 |
| JP | 4375820 B2 | 12/2009 |
| JP | 2015-514839 A | 5/2015 |
| JP | 2015-127375 A | 7/2015 |
| TW | 201431868 A | 8/2014 |
| WO | WO 2005/049546 A1 | 6/2005 |
| WO | WO 2005/059951 A2 | 6/2005 |
| WO | WO 2011/040531 A1 | 4/2011 |

OTHER PUBLICATIONS

International Search Report issued in PCT/JP2017/042809 (PCT/ISA/210), dated Feb. 20, 2018.

Sarigiannis et al., "Optical and electrochemical properties of polyfluorenes with pyridine-triphenylamine bipolar unit", Polymer International, vol. 62, 2013, pp. 196-203.

Shi et al., "Novel luminescent polymers containing backbone triphenylamine groups and pendant quinoxaline groups", Dyes and Pigments, vol. 83, 2009, pp. 102-110.

Shi et al., "Pendant-decorated polytriphenylamine derivative: potential blue-emitting and hole transporting material", Polymer Bulletin, vol. 64, Issue 1, 2010, pp. 53-65.

Extended European Search Report, dated Jun. 4, 2020, for European Application No. 17876396.7.

Structual Unit 1

Structual Unit 2

Structual Unit 3

Structual Unit 4

Structual Unit 5

Structual Unit 6

Structual Unit 7

Structual Unit 8

Structual Unit 9

Structual Unit 10

Structual Unit 11

Structual Unit 12

Structual Unit 13

Structual Unit 14

Structual Unit 15

Structual Unit 16

Structual Unit 17

Structual Unit 18

Structual Unit 19

Structual Unit 20

Structual Unit 21

Structural Unit 25

Structural Unit 26

Structural Unit 27

Structual Unit 28

Structual Unit 29

Structual Unit 30

Structual Unit 31

(2 a)

(2 b)

(2 i)

(2 j)

(2 k)

(2 l)

(2 m)

(2 n)

(2 o)

(2 p)

(3 f)

(3 g)

(3 h)

(3 i)

(3 j)

(3 k)

(3 l)

(3 m)

(3 n)

(3 o)

(3 p)

(3 q)

(3 r)

(3 w)

(3 x)

HIGH MOLECULAR WEIGHT COMPOUND CONTAINING SUBSTITUTED TRIARYLAMINE STRUCTURAL UNIT

TECHNICAL FIELD

The present invention relates to a high molecular weight compound suitable for use in an organic electroluminescent element (organic EL element) that is a self-emissive element preferably used in various types of display apparatuses, and the organic electroluminescent element.

BACKGROUND ART

Organic EL elements are self-emissive elements, and therefore are brighter than liquid crystal elements, have excellent display viewability, and can provide a clear display, so that active studies have been carried out on the organic EL elements.

An organic EL element has a configuration in which a thin film (organic layer) made of an organic compound is located between a positive electrode and a negative electrode. The method for forming the thin film can be roughly classified into a vacuum deposition method and a coating method. The vacuum deposition method is a method in which a thin film is formed on a substrate in vacuum using mainly a low molecular weight compound, and is a technique that is already in practical use. On the other hand, the coating method is a method in which a thin film is formed on a substrate through inkjet printing or printing using a solution composed mainly of a polymer compound. This method is a technique that is essential for future large area organic EL displays because it has high material usage efficiency and is suitable for larger area and higher resolution displays.

The vacuum deposition method in which a low molecular weight material is used has very low material usage efficiency. Accordingly, if the vacuum deposition method is used to produce a large display, there may be significant warping of a shadow mask, which makes it difficult to deposit a uniform thin film on a large substrate. There is also the issue of the production cost being high.

On the other hand, with a polymer material, a uniform film can be formed even on a large substrate by applying a solution prepared by dissolving the polymer material in an organic solvent. Thus, a coating method as typified by an inkjet printing method or a printing method can be used. Accordingly, the material usage efficiency can be increased, and thus the cost of producing elements can be reduced significantly.

Various studies have been conducted on organic EL elements in which a polymer material is used. However, there is still a problem in that the element characteristics such as light emission efficiency and lifespan are not necessarily sufficient (see, for example, Patent Literatures 1 to 5).

Also, a fluorene polymer called TFB is known as a typical polymer hole transport material that has been used in organic EL elements (see Patent Literatures 6 and 7). However, TFB has insufficient hole transportability and insufficient electron blockability. Accordingly, there is a problem in that some electrons pass through a light emitting layer, and thus an improvement in light emission efficiency cannot be expected. There is also another problem in that TFB has low film adhesion to adjacent layers, and thus an increase in the lifespan of elements cannot be expected.

CITATION LIST

Patent Literature

Patent Literature 1: JP 2005-272834A
Patent Literature 2: JP 2007-119763A
Patent Literature 3: JP 2007-162009A
Patent Literature 4: JP 2007-177225A
Patent Literature 5: WO 2005/049546
Patent Literature 6: Japanese Patent No. 4375820
Patent Literature 7: WO 2005/59951

SUMMARY OF INVENTION

Technical Problem

It is an object of the present invention to provide a polymer material that has excellent hole injection and transport performance, is capable of blocking electrons, and is highly stable as a thin film.

It is another object of the present invention to provide an organic EL element that includes an organic layer (thin film) made of the above-described polymer material, wherein the organic EL element has high light emission efficiency and a long lifespan.

Solution to Problem

The inventors of the present invention noticed that a substituted triarylamine structure has high hole injection/transport capability, and conducted studies by synthesizing polymer compounds having various types of substituted triarylamine structures. As a result, they found a high molecular weight compound having a novel structure that has, in addition to the hole injection/transport capability, heat resistance and thin film stability. The present invention has thereby been accomplished.

The present invention provides a high molecular weight compound including a substituted triarylamine structural unit represented by the following general formula (1);

[Chem. 1]

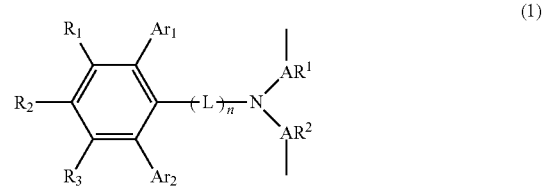

(1)

wherein $AR^1$, $AR^2$, and L each independently represent a divalent aromatic hydrocarbon group or a divalent aromatic heterocyclic group, n is an integer of 1 to 3, $Ar_1$ and $Ar_2$ each independently represent an aryl group or a heteroaryl group, and $R_1$, $R_2$, and $R_3$ each independently represent a hydrogen atom, a heavy hydrogen atom, a fluorine atom, a chlorine atom, a cyano group, a nitro group, an alkyl group having 1 to 6 carbon atoms, an alkyloxy group having 1 to 6 carbon atoms, a cycloalkyl group having 5 to 10 carbon atoms, a cycloalkyloxy group having 5 to 10 carbon atoms, an alkenyl group having 2 to 6 carbon atoms, an aryl group, an aryloxy group, or a heteroaryl group.

In the high molecular weight compound according to the present invention, it is preferable that:

(1) the high molecular weight compound comprises a repeating unit including the structural unit, and has a weight average molecular weight on a polystyrene basis of 10,000 or more and less than 1,000,000;

(2) in the general formula (1), $Ar_1$ and $Ar_2$ each independently represent an aryl group;

(3) $Ar_1$ and $Ar_2$ each independently represent: an aryl group having no substituent group; or an aryl group substituted with a phenyl group;

(4) $Ar_1$ and $Ar_2$ represent a phenyl group, a biphenylyl group, a naphthyl group, a phenanthrenyl group, or a fluorenyl group;

(5) in the general formula (1), $R_1$ and $R_3$ each independently represent a hydrogen atom or a heavy hydrogen atom;

(6) in the general formula (1), L represents a phenylene group, in particular, a 1,4-phenylene group (p-phenylene group); and (7) the high molecular weight compound is a copolymer comprising, in addition to the structural unit represented by the general formula (1), a structural unit including a group having at least one aromatic hydrocarbon ring or including a triarylamine backbone.

The present invention also provides an organic EL element including: a pair of electrodes; and at least one organic layer located between the pair of electrodes, wherein the organic layer contains the high molecular weight compound described above.

In the organic EL element according to the present invention, it is preferable that the organic layer is a hole transport layer, an electron blocking layer, a hole injection layer, or a light emitting layer.

Advantageous Effects of Invention

The high molecular weight compound of the present invention including a substituted triarylamine structural unit (divalent group) represented by the general formula (1) described above is, for example, a polymer that includes a repeating unit including the structural unit, and preferably has a weight average molecular weight on a polystyrene basis measured using GPC (gel permeation chromatography) of 10,000 or more and less than 1,000,000.

The high molecular weight compound has the following characteristics:

(1) good hole injectionability;
(2) high hole mobility;
(3) excellent electron blocking capability;
(4) good thin film stability; and
(5) excellent heat resistance.

An organic EL element in which an organic layer made of the high molecular weight compound described above such as, for example, a hole transport layer, an electron blocking layer, a hole injection layer, or a light emitting layer is formed between a pair of electrodes has the following advantages:

(1) high light emission efficiency and high power efficiency;
(2) a low actual driving voltage; and
(3) a long lifespan.

DESCRIPTION OF EMBODIMENTS

<Substituted Triarylamine Structural Unit>

Figure 1:
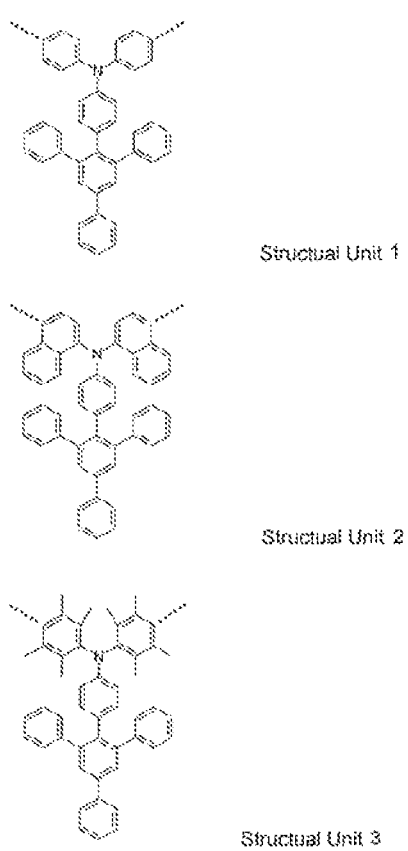
FIG. 1 is a diagram showing the chemical structures of structural units 1 to 3 preferably used as a substituted triarylamine structural unit included in a high molecular weight compound according to the present invention.
Figure 2:
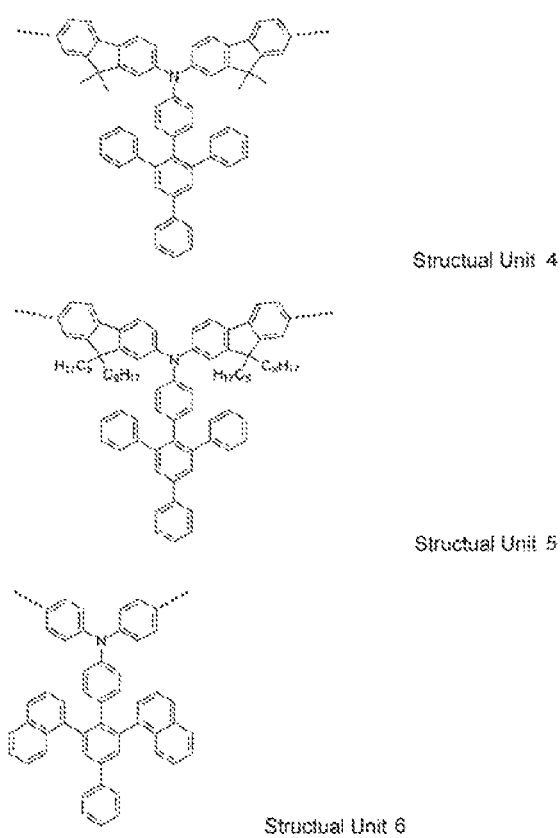
FIG. 2 is a diagram showing the chemical structures of structural units 4 to 6 preferably used as the substituted triarylamine structural unit included in the high molecular weight compound according to the present invention.
Figure 3:
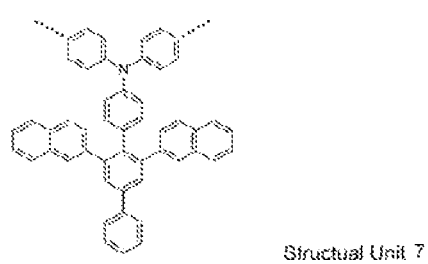
FIG. 3 is a diagram showing the chemical structures of structural units 7 to 9 preferably used as the substituted triarylamine structural unit included in the high molecular weight compound according to the present invention.
Figure 3:
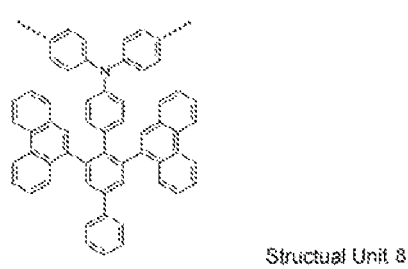
Figure 3:
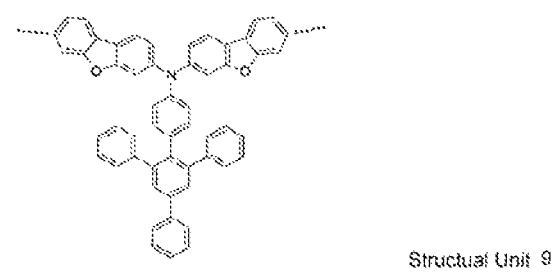
Figure 4:
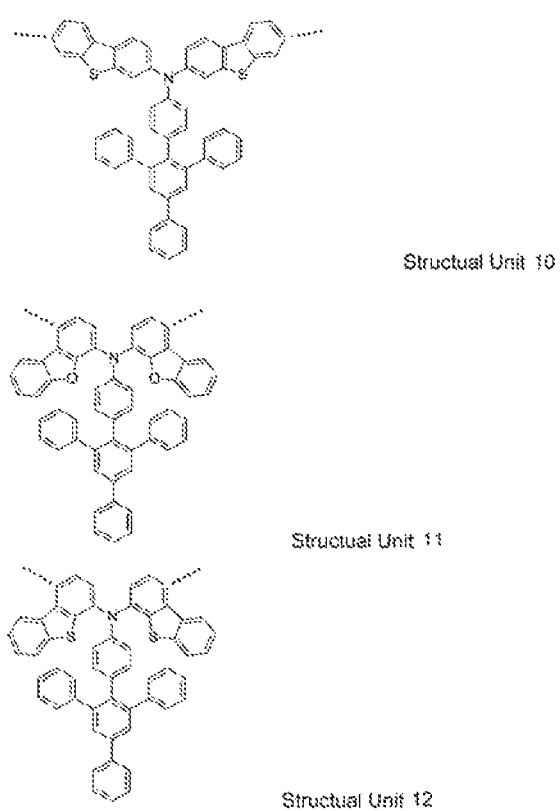
FIG. 4 is a diagram showing the chemical structures of structural units 10 to 12 preferably used as the substituted triarylamine structural unit included in the high molecular weight compound according to the present invention.
Figure 5:
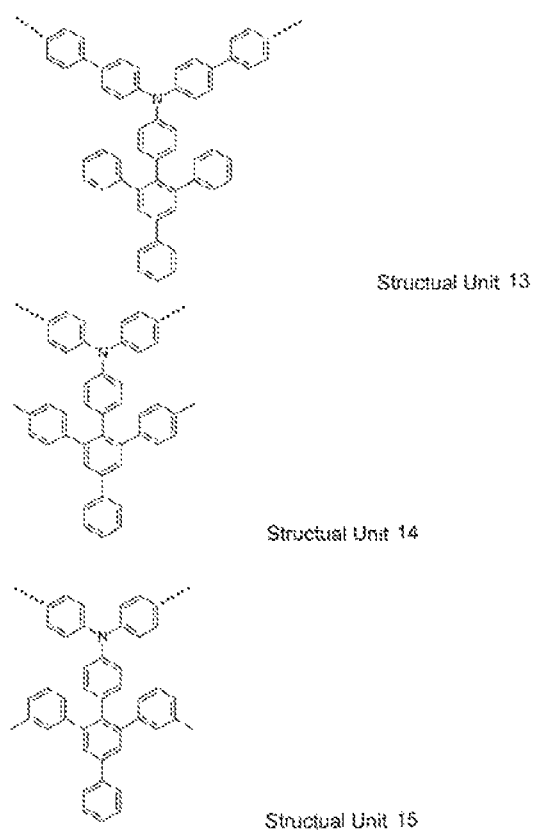
FIG. 5 is a diagram showing the chemical structures of structural units 13 to 15 preferably used as the substituted triarylamine structural unit included in the high molecular weight compound according to the present invention.
Figure 6:
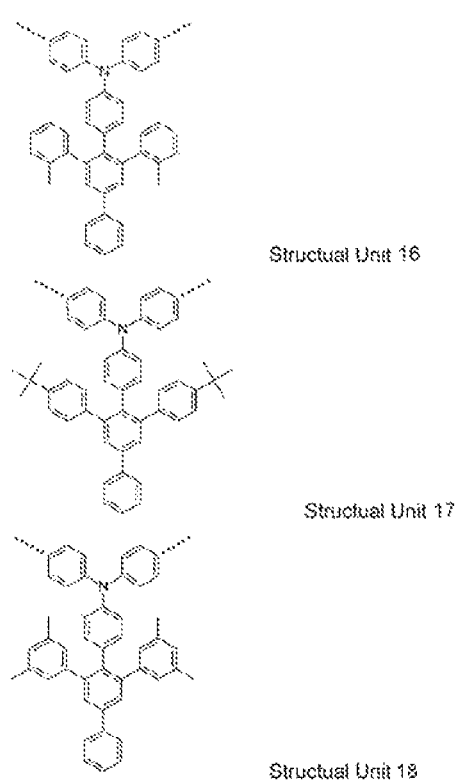
FIG. 6 is a diagram showing the chemical structures of structural units 16 to 18 preferably used as the substituted triarylamine structural unit included in the high molecular weight compound according to the present invention.
Figure 7:
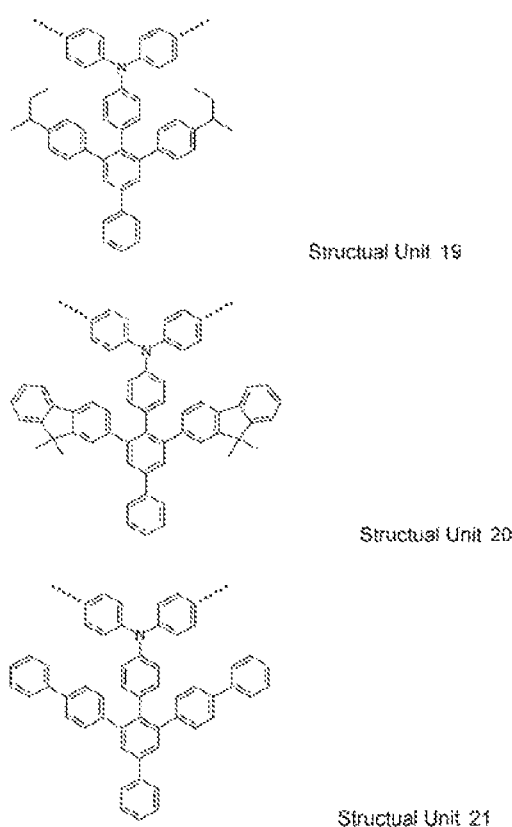
FIG. 7 is a diagram showing the chemical structures of structural units 19 to 21 preferably used as the substituted triarylamine structural unit included in the high molecular weight compound according to the present invention.
Figure 8:
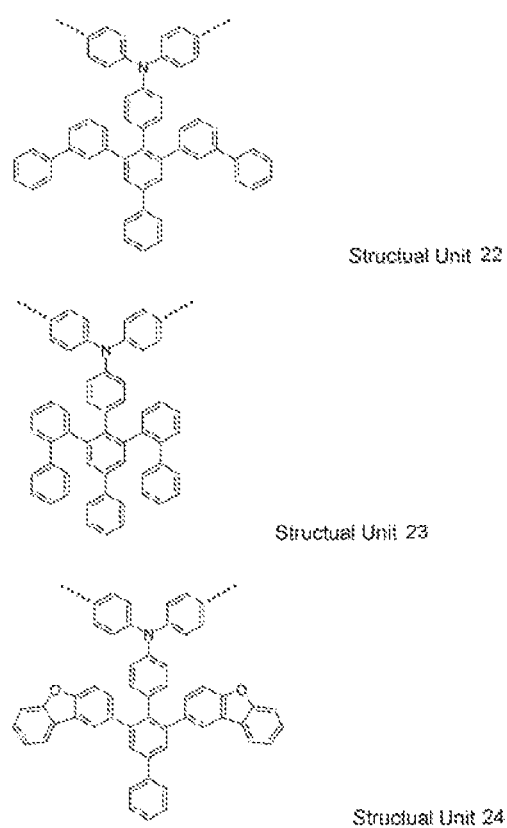
FIG. 8 is a diagram showing the chemical structures of structural units 22 to 24 preferably used as the substituted triarylamine structural unit included in the high molecular weight compound according to the present invention.
Figure 9:
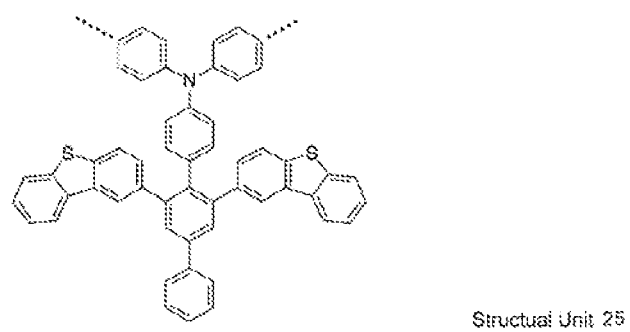
FIG. 9 is a diagram showing the chemical structures of structural units 25 to 27 preferably used as the substituted triarylamine structural unit included in the high molecular weight compound according to the present invention.
Figure 9:
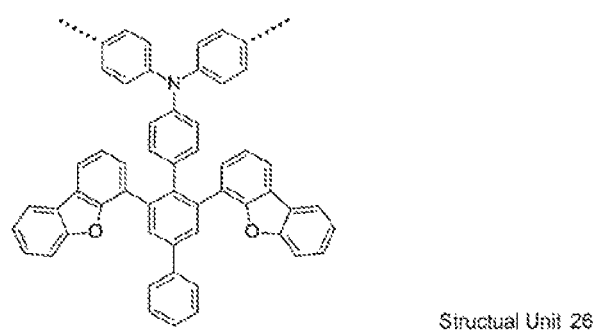
Figure 9:
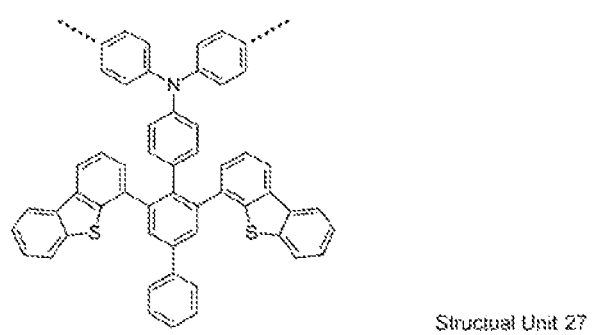
Figure 10:
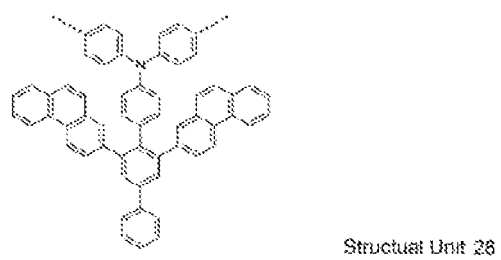
FIG. 10 is a diagram showing the chemical structures of structural units 28 to 30 preferably used as the substituted triarylamine structural unit included in the high molecular weight compound according to the present invention.
Figure 10:
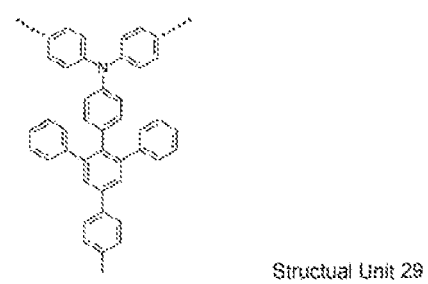
Figure 10:
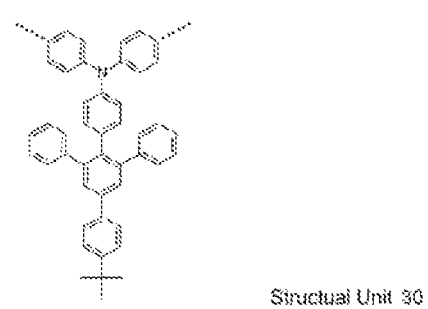
Figure 11:
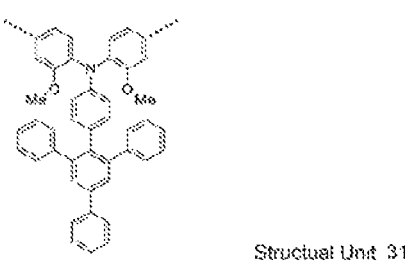
FIG. 11 is a diagram showing the chemical structure of structural unit 31 preferably used as the substituted triarylamine structural unit in the high molecular weight compound according to the present invention.
Figure 12:
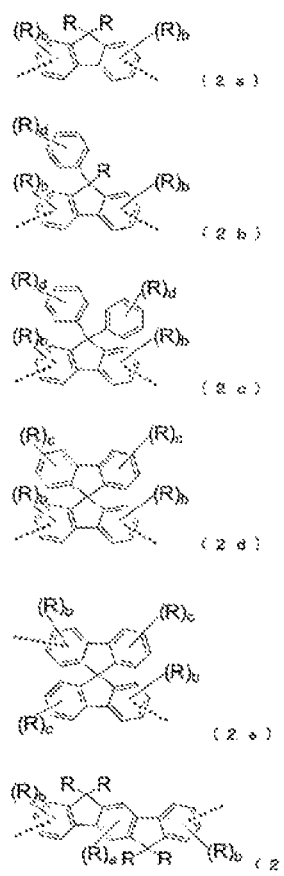
FIG. 12 is a diagram showing the chemical structures of structural units (2a) to (2f) introduced to improve the solubility in an organic solvent.
Figure 13:
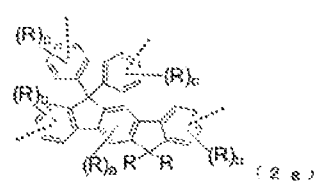
FIG. 13 is a diagram showing the chemical structures of structural units (2g) to (2k) introduced to improve the solubility in an organic solvent.
Figure 13:
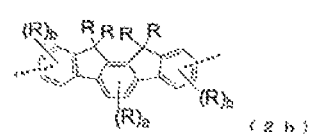
Figure 13:
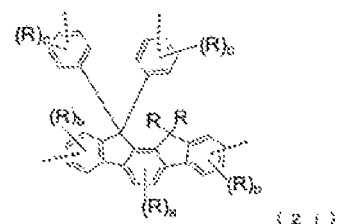
Figure 13:
Figure 13:
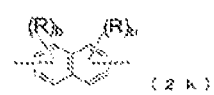
Figure 14:
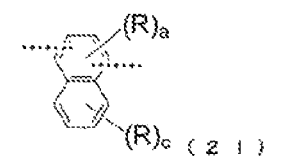
FIG. 14 is a diagram showing the chemical structures of structural units (2l) to (2p) introduced to improve the solubility in an organic solvent.
Figure 14:
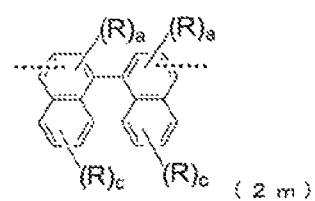
Figure 14:
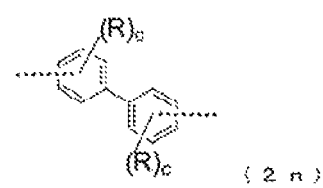
Figure 14:
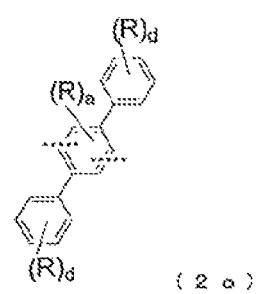
Figure 14:
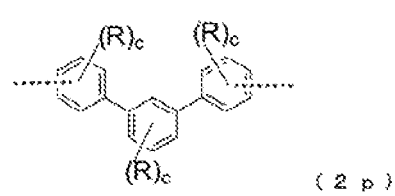
Figure 15:
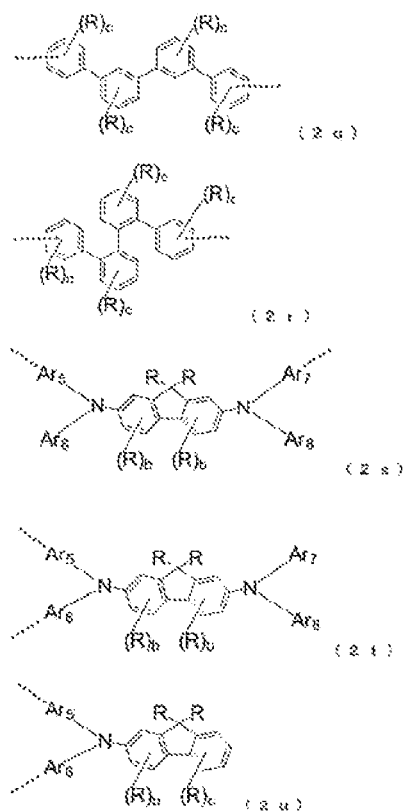
FIG. 15 is a diagram showing the chemical structures of structural units (2q) to (2u) introduced to improve the solubility in an organic solvent.
Figure 16:
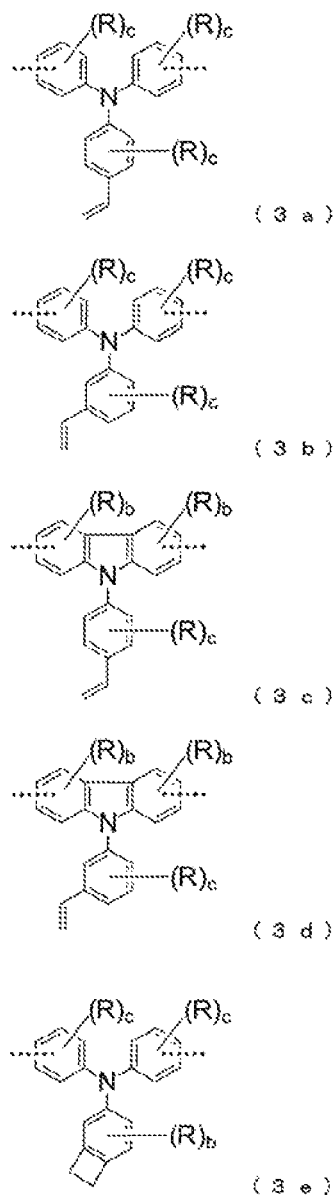
FIG. 16 is a diagram showing the chemical structures of structural units (3a) to (3e) introduced to improve thermal crosslinkability.
Figure 17:
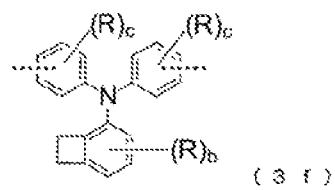
FIG. 17 is a diagram showing the chemical structures of structural units (3f) to (3j) introduced to improve thermal crosslinkability.
Figure 17:
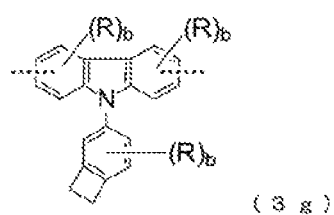
Figure 17:
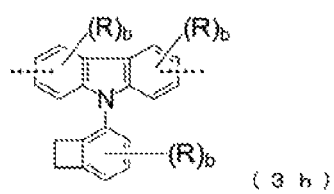
Figure 17:
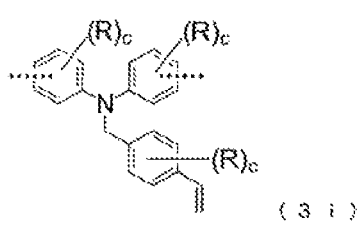
Figure 17:
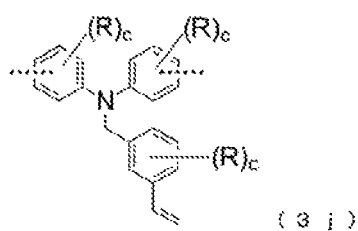
Figure 18:
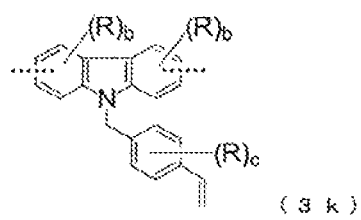
FIG. 18 is a diagram showing the chemical structures of structural units (3k) to (3n) introduced to improve thermal crosslinkability.
Figure 18:
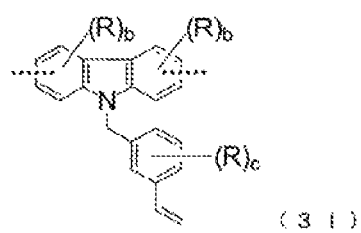
Figure 18:
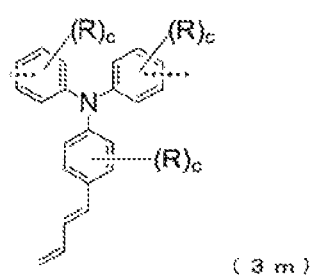
Figure 18:
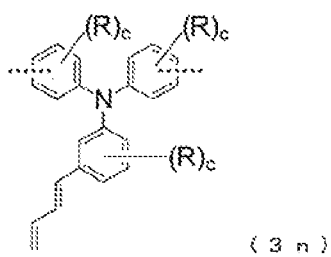
Figure 19:
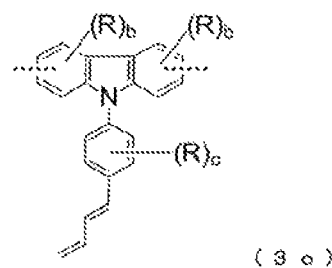
FIG. 19 is a diagram showing the chemical structures of structural units (3o) to (3r) introduced to improve thermal crosslinkability.
Figure 19:
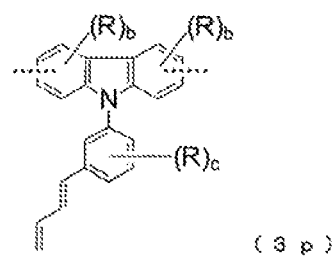
Figure 19:
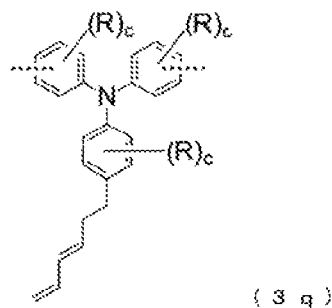
Figure 19:
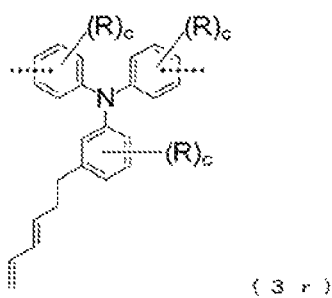
Figure 20:
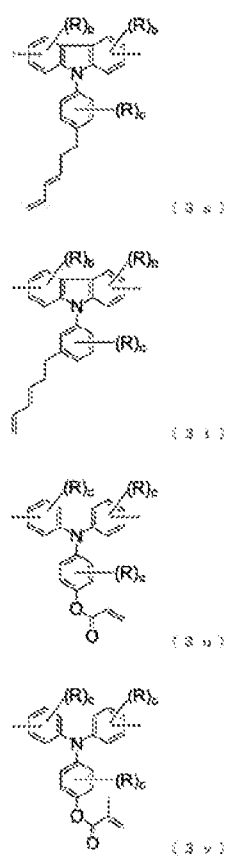
FIG. 20 is a diagram showing the chemical structures of structural units (3s) to (3v) introduced to improve thermal crosslinkability.
Figure 21:
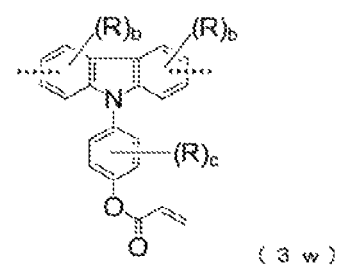
FIG. 21 is a diagram showing the chemical structures of structural units (3w) and (3x) introduced to improve thermal crosslinkability.
Figure 21:
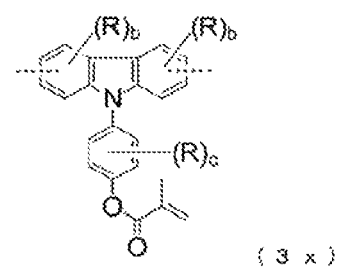

A substituted triarylamine structural unit included in a high molecular weight compound according to the present invention is a divalent group, and is represented by the following general formula (1).

[Chem. 2]

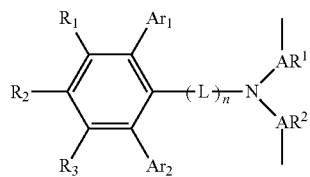

(1)

In the general formula (1), $AR^1$ and $AR^2$ may each independently represent a divalent aromatic hydrocarbon group or a divalent aromatic heterocyclic group, and AR' and $AR^2$ may be the same or different.

The aromatic ring of the divalent aromatic hydrocarbon group may be a monocyclic ring or a fused ring. Examples of the aromatic ring include a benzene ring, a naphthalene ring, an anthracene ring, a phenanthrene ring, a fluorine ring, an indene ring, a pyrene ring, a perylene ring, a fluoranthene ring, and a triphenylene ring. These aromatic rings may have a substituent group.

Likewise, the heterocyclic ring of the divalent aromatic heterocyclic group may be a monocyclic ring or a fused ring. Examples of the heterocyclic ring include a pyridine ring, a pyrimidine ring, a triazine ring, a quinolone ring, an isoquinoline ring, a benzofuran ring, a benzothiophene ring, an indole ring, a carbazole ring, a benzoxazole ring, a benzothiazole ring, a dibenzofuran ring, a quinoxaline ring, a benzimidazole ring, a pyrazole ring, a dibenzofuran ring, a dibenzothiophene ring, a naphthyridine ring, a phenanthroline ring, an acridine ring, a carboline ring, and the like. These aromatic heterocyclic rings may also have a substituent group.

The substituent group that may be included in the aromatic ring and the aromatic heterocyclic ring described above may be a heavy hydrogen atom, a cyano group, a nitro group, or the like. Other examples of the substituent group include:

halogen atoms such as a fluorine atom, a chlorine atom, a bromine atom, and an iodine atom;

alkyl groups, in particular, an alkyl group having 1 to 8 carbon atoms, such as a methyl group, an ethyl group, an n-propyl group, an isopropyl group, an n-butyl group, an isobutyl group, a tert-butyl group, an n-pentyl group, an isopentyl group, a neopentyl group, an n-hexyl group, an isohexyl group, a neohexyl group, an n-heptyl group, an isoheptyl group, a neoheptyl group, an n-octyl group, an isooctyl group, and a neooctyl group;

alkyloxy groups, in particular, an alkyloxy group having 1 to 8 carbon atoms, such as, a methyloxy group, an ethyloxy group, and a propyloxy group;

alkenyl groups such as a vinyl group, and an allyl group;

aryloxy groups such as a phenyloxy group, and a tolyloxy group;

aryl groups such as a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, and a triphenylenyl group;

heteroaryl groups such as a pyridyl group, a pyrimidinyl group, a triazinyl group, a thienyl group, a furyl group, a pyrrolyl group, a quinolyl group, an isoquinolyl group, a benzofuranyl group, a benzothienyl group, an indolyl group, a carbazolyl group, a benzooxazolyl group, a benzothiazolyl group, a quinoxalinyl group, a benzimidazolyl group, a pyrazolyl group, a dibenzofuranyl group, a dibenzothienyl group, and a carbolinyl group;

aryl vinyl groups such as a styryl group, and a naphthyl vinyl group; and acyl groups such as an acetyl group, and a benzoyl group.

The substituent groups listed above may further have any of the substituent groups listed above.

Furthermore, it is preferable that these substituent groups are each independently present. However, these substituent groups may be fused to each other to form a ring via a single bond, a methylene group that may have a substituent group, an oxygen atom, or a sulfur atom.

In the present invention, $AR^1$ and $AR^2$ described above preferably represent a carbazolyl group, a dibenzofuranyl group, a dibenzothienyl group, a naphthyl group, a phenanthrenyl group, a phenyl group, or a fluorenyl group having a substituent group.

The substituent group of the fluorenyl group is preferably a methyl group, an ethyl group, an n-propyl group, an n-butyl group, an n-pentyl group, an n-hexyl group, an n-heptyl group, an n-octyl group, or a phenyl group.

In the general formula (1), L represents a divalent aromatic hydrocarbon group or a divalent aromatic heterocyclic group. Examples of the divalent aromatic hydrocarbon group and the divalent aromatic heterocyclic group are the same as those listed for AR' and $AR^2$ above. Furthermore, the aromatic hydrocarbon group and the aromatic heterocyclic group may have a substituent group. These substituent groups are the same as those that $AR^1$ and $AR^2$ which are divalent groups may have. Also, as with the substituent groups that may be included in $AR^1$ and $AR^2$, these substituent groups may further have a substituent group. Furthermore, it is desirable that these substituent groups are each independently present. However, as with the substituent groups that may be included in $AR^1$ and $AR^2$, these substituent groups may be fused to each other to form a ring.

n is an integer of 1 to 3, and is preferably 1.

When n is 2 or 3, a plurality of Ls may be the same or different.

In the high molecular weight compound according to the present invention, L preferably represents a divalent aromatic hydrocarbon group, and more preferably a phenylene group, and most preferably a 1,4-phenylene group (p-phenylene group).

Also, in the general formula (1), $Ar_1$ and $Ar_2$ represent a monovalent group such as an aryl group or a heteroaryl group. $Ar_1$ and $Ar_2$ may be the same or different.

Examples of the aryl group include a phenyl group, a naphthyl group, an anthracenyl group, a phenanthrenyl group, a fluorenyl group, an indenyl group, a pyrenyl group, a perylenyl group, a fluoranthenyl group, a triphenylenyl group, and the like.

Examples of the heteroaryl group include a pyridyl group, a pyrimidinyl group, a triazinyl group, a furyl group, a pyrrolyl group, a thienyl group, a quinolyl group, an isoquinolyl group, a benzofuranyl group, a benzothienyl group, an indolyl group, a carbazolyl group, a benzooxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, a carbolinyl group, and the like.

The aryl group and the heteroaryl group described above may have a substituent group. These substituent groups are the same as those that $AR^1$ and $AR^2$ which are divalent groups may have. Also, as with the substituent groups that may be included in $AR^1$ and $AR^2$, these substituent groups may further have a substituent group.

For example, the aryl group and the heteroaryl group described above may be substituted with a phenyl group, and the phenyl group may be further substituted with a phenyl group. That is, in the case of an aryl group, the aryl group may be a biphenylyl group or a terphenylyl group.

Furthermore, the aryl group, the heteroaryl group and various types of substituent groups described above are preferably each independently present, but as with the substituent groups that may be included in $AR^1$ and $AR^2$, may be fused to each other to form a ring.

In the high molecular weight compound according to the present invention, $Ar_1$ and $Ar_2$ preferably represent an aryl group, and more preferably an aryl group having no substituent group, or an aryl group substituted with a phenyl group or a methyl group. Specific examples of such a preferable group include a phenyl group, a biphenylyl group, a naphthyl group, a phenanthrenyl group, and a fluorenyl group substituted with a methyl group.

Also, from the viewpoint of synthesis, $Ar_1$ and $Ar_2$ in the general formula (1) preferably are the same group.

Furthermore, in the general formula (1), $R_1$, $R_2$, and $R_3$ may be the same, and represent a hydrogen atom, a heavy hydrogen atom, a fluorine atom, a chlorine atom, a cyano group, a nitro group, an alkyl group having 1 to 6 carbon atoms, an alkyloxy group having 1 to 6 carbon atoms, a cycloalkyl group having 5 to 10 carbon atoms, a cycloalkyloxy group having 5 to 10 carbon atoms, an alkenyl group having 2 to 6 carbon atoms, an aryl group, an aryloxy group, or a heteroaryl group.

Examples of the alkyl group, the alkyloxy group, the cycloalkyl group, the cycloalkyloxy group, the alkenyl group, the aryl group, the aryloxy group, and the heteroaryl group that may be represented by $R_1$ to $R_3$ are as follows.

Examples of the alkyl group ($C_1$ to $C_6$) include a methyl group, an ethyl group, an n-propyl group, an isopropyl group, an n-butyl group, an isobutyl group, a tert-butyl group, an n-pentyl group, an isopentyl group, a neopentyl group, an n-hexyl group, and the like.

Examples of the alkyloxy group ($C_1$ to $C_6$) include a methyloxy group, an ethyloxy group, an n-propyloxy group, an isopropyloxy group, an n-butyloxy group, a tert-butyloxy group, an n-pentyloxy group, an n-hexyloxy group, and the like.

Examples of the cycloalkyl group ($C_5$ to $C_{10}$) include a cyclopentyl group, a cyclohexyl group, a 1-adamantyl group, a 2-adamantyl group, and the like.

Examples of the cycloalkyloxy group ($C_5$ to $C_{10}$) include a cyclopentyloxy group, a cyclohexyloxy group, a cycloheptyloxy group, a cyclooctyloxy group, a 1-adamantyloxy group, a 2-adamantyloxy group, and the like.

Examples of the alkenyl group ($C_2$ to $C_6$) include a vinyl group, an allyl group, an isopropenyl group, a 2-butenyl group, and the like.

Examples of the aryl group include a phenyl group, a naphthyl group, an anthracenyl group, a phenanthrenyl group, a fluorenyl group, an indenyl group, a pyrenyl group, a perylenyl group, a fluoranthenyl group, and the like.

Examples of the aryloxy group include a phenyloxy group, a tolyloxy group, and the like.

Examples of the heteroaryl group include a pyridyl group, a pyrimidinyl group, a triazinyl group, a furyl group, a pyrrolyl group, a thienyl group, a quinolyl group, an isoquinolyl group, a benzofuranyl group, a benzothienyl group, an indolyl group, a carbazolyl group, a benzooxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, a carbolinyl group, and the like.

$R_1$ to $R_3$ described above may also have substituent groups. These substituent groups are the same as those that $AR^1$ and $AR^2$ which are divalent groups may have. Also, as with the substituent groups that may be included in $AR^1$ and $AR^2$, these substituent groups may further have a substituent group.

Furthermore, $R_1$ to $R_3$ described above and various types of substituent groups are preferably each independently present, but, as with the substituent groups that may be included in $AR^1$ and $AR^2$, may be bonded to each other to form a ring.

In $R_1$ to $R_3$ described above in the high molecular weight compound according to the present invention, $R_1$ and $R_3$ preferably represent a hydrogen atom or a heavy hydrogen atom, and most preferably a hydrogen atom from the viewpoint of synthesis.

Also, $R_2$ preferably represents a substituted or unsubstituted aryl group, and more preferably a phenyl group, a biphenylyl group, a naphthyl group, a phenanthrenyl group, or a fluorenyl group, and even more preferably an unsubstituted phenyl group. Here, the substituent group of the fluorenyl group is preferably a methyl group.

Specific examples of the substituted triarylamine structural unit represented by the above-described general formula (1) of the present invention are shown as structural units 1 to 31 in FIGS. 1 to 11.

In the chemical formulas shown in FIGS. 1 to 11, each broken line indicates a bond to an adjacent structural unit, and for each solid line that extends from a ring and has a free end, unlike the general formula (1), the free end indicates a methyl group.

<High Molecular Weight Compound>

As already described above, the high molecular weight compound according to the present invention that includes a structural unit represented by the general formula (1) given above has excellent characteristics such as hole injection characteristics, hole mobility, electron blocking capability, thin film stability, and heat resistance. From the viewpoint of enhancing the characteristics and ensuring film formability, the high molecular weight compound according to the present invention is preferably a polymer that includes a repeating unit including the above-described structural unit, and has, for example, a weight average molecular weight on a polystyrene basis measured using GPC preferably in a range of 10,000 or more and less than 1,000,000, more preferably in a range of 10,000 or more and less than 500,000, and even more preferably in a range of 10,000 or more and less than 200,000.

Also, the high molecular weight compound according to the present invention may be a homopolymer that includes the above-described structural unit. However, in order to ensure coatability, adhesion to other layers, and durability when the high molecular weight compound according to the present invention is used to form, for example, an organic layer in an organic EL element through coating, the high molecular weight compound according to the present invention is preferably a copolymer including the above-described structural unit and other structural unit.

The other structural unit may be, for example, a structural unit for enhancing the solubility in an organic solvent, or a structural unit for enhancing the thermal crosslinkability of polymers.

The structural unit for enhancing the solubility in an organic solvent may have at least one aromatic hydrocarbon ring, and specific examples are shown as formulas (2a) to (2u) in FIGS. 12 to 15.

In the formulas (2a) to (2u), each broken line indicates a bond to an adjacent structural unit, and for each solid line that extends from a ring and has a free end, the free end indicates a methyl group.

Also, in the formulas, the subscripts a to d represent the following numbers.
a=0, 1, or 2
b=0, 1, 2, or 3
c=0, 1, 2, 3, or 4
d=0, 1, 2, 3, 4, or 5

Also, in the formulas (2a) to (2u), R represents: a hydrogen atom; a heavy hydrogen atom; a cyano group; a nitro group; a halogen atom such as a fluorine atom, a chlorine atom, a bromine atom, or an iodine atom; an alkyl group having 40 carbon atoms or less (particularly 3 to 40 carbon atoms); a cycloalkyl group having 40 carbon atoms or less (particularly 3 to 40 carbon atoms); an alkoxy group having 40 carbon atoms or less (particularly 3 to 40 carbon atoms); or a thioalkoxy group having 40 carbon atoms or less (particularly 3 to 40 carbon atoms).

Furthermore, $Ar_5$ to $Ar_8$ may be the same or different from each other, and represent a monovalent or divalent aromatic hydrocarbon group, or a monovalent or divalent aromatic heterocyclic group. Examples of the monovalent aromatic hydrocarbon group and the monovalent aromatic heterocyclic group may be the same as those listed as examples of the aryl group and the heteroaryl group represented by $Ar_1$ and $Ar_2$ in the general formula (1). Also, examples of the divalent aromatic hydrocarbon group and the divalent aromatic heterocyclic group may be the same as those listed as examples of the groups represented by $AR^1$ and $AR^2$ in the general formula (1).

As with $AR^1$ and $AR^2$, the monovalent or divalent aromatic hydrocarbon group or the monovalent or divalent aromatic heterocyclic group may also have a substituent group.

The structural unit for enhancing thermal crosslinkability may be a structural unit including a triarylamine backbone that is different from the structural unit represented by the general formula (1), and specific examples are shown as formulas (3a) to (3x) in FIGS. 16 to 21.

In the formulas (3a) to (3x), the broken lines, the group R, and the subscripts a to d represent the same as those of the formulas (2a) to (2u) described above.

In the high molecular weight compound according to the present invention, when the structural unit 1 represented by the general formula (1) is denoted by A, the structural unit for enhancing the solubility in an organic solvent is denoted by B, and the structural unit for enhancing thermal crosslinkability is denoted by C, the amount of structural unit A in the high molecular weight compound is preferably 1 mol % or more, and more preferably 5 mol % or more. On the condition that the high molecular weight compound according to the present invention includes the structural unit A in the above-described amount, the high molecular weight compound includes the structural unit B in an amount of preferably 1 mol % or more, and more preferably 30 to 90 mol %, and the structural unit C in an amount of preferably 1 mol % or more, and more preferably 5 to 20 mol %. From the viewpoint of forming an organic layer in the organic EL element, it is most preferable that the high molecular weight compound according to the present invention is a terpolymer that includes the structural units A, B, and C so as to satisfy the above conditions.

The high molecular weight compound according to the present invention described above can be synthesized by forming C—C bonds or C—N bonds through a Suzuki polymerization reaction or a HARTWIG-BUCHWALD polymerization reaction so as to connect the structural units.

Specifically, the high molecular weight compound according to the present invention can be synthesized by preparing unit compounds that respectively have the above-described structural units, and subjecting the unit compounds to borate esterification or halogenation as appropriate and then to a polycondensation reaction using an appropriate catalyst.

For example, as the compound for introducing the structural unit represented by the general formula (1), a triarylamine derivative represented by the following general formula (1a) can be used.

[Chem. 3]

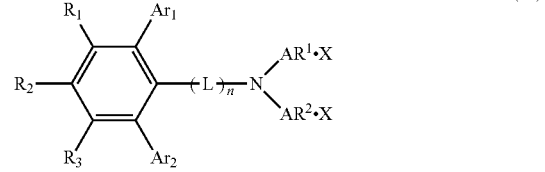

(1a)

wherein, X represents a hydrogen atom or a halogen atom (particularly Br), and $AR^1$, $AR^2$, L, n, $Ar_1$, $Ar_2$, and $R_1$ to $R_3$ represent the same as those of the general formula (1).

That is, in the general formula (1a) given above, in the case where X is a hydrogen atom, the compound for introducing the structural unit represented by the general formula (1) is obtained. In the case where X is a halogen atom, a halide used to synthesize a polymer is obtained.

The high molecular weight compound according to the present invention described above is dissolved in an aromatic organic solvent such as benzene, toluene, xylene, or anisole so as to prepare a coating solution, and the coating solution is applied to a predetermined substrate to form a coating, and then the coating is heated and dried. In this way, a thin film that has excellent characteristics such as hole injectionability, hole transportability, and electron blockability can be formed. The thin film also has good heat resistance and good adhesion to other layers.

For example, the high molecular weight compound described above can be used as a constituent material of a hole injection layer and/or a hole transport layer included in an organic EL element. The hole injection layer or the hole transport layer formed using the high molecular weight compound described above has higher hole injectionability, greater mobility, and higher electron blockability than the hole injection layer or the hole transport layer formed using a conventional material. Furthermore, the hole injection layer or the hole transport layer formed using the high molecular weight compound described above can confine excitons generated in a light emitting layer, improve the probability of recombination of holes and electrons, and provide high light emission efficiency, and at the same time, achieve advantages of reducing the driving voltage and improving the durability of the organic EL element.

Also, the high molecular weight compound according to the present invention that has the electrical characteristics described above can also be preferably used to form an electron blocking layer or a light emitting layer.

<Organic EL Element>

An organic EL element that includes an organic layer formed using the high molecular weight compound according to the present invention described above has, for example, a structure shown in FIG. 22.

Specifically, a transparent positive electrode 2, a hole injection layer 3, a hole transport layer 4, a light emitting layer 5, an electron transport layer 6, and a negative electrode 7 are formed on a glass substrate 1, which may be a transparent substrate such as a transparent resin substrate.

Of course, the layer structure of the organic EL element to which the high molecular weight compound according to the present invention is applied is not limited to that described above. A hole blocking layer may be formed between the light emitting layer 5 and the electron transport layer 6. Also, an electron blocking layer or the like may be formed between the hole transport layer 4 and the light emitting layer 5. Furthermore, an electron injection layer may be formed between the negative electrode 7 and the electron transport layer 6. Furthermore, some layers may be omitted. For example, the organic EL element may have a simple layer structure in which a positive electrode 2, a hole transport layer 4, a light emitting layer 5, an electron transport layer 6, and a negative electrode 7 are formed on a substrate 1. A double-layer structure may be used in which layers having the same function are overlaid.

Taking advantage of characteristics such as hole injectionability and hole transportability, the high molecular weight compound according to the present invention is preferably used as a material for forming an organic layer (for example, a light emitting layer 5, a hole injection layer 3, a hole transport layer 4, a light emitting layer 5, or an unshown hole blocking layer) that is formed between the positive electrode 2 and the negative electrode 7.

In the organic EL element described above, the transparent positive electrode 2 may be made of a conventionally known electrode material, and is formed by depositing an electrode material that has a large work function, such as ITO or gold, on a substrate 1 (a transparent substrate such as a glass substrate).

Also, the hole injection layer 3 formed on the transparent positive electrode 2 can be formed using a coating solution prepared by dissolving the high molecular weight compound according to the present invention in, for example, an aromatic organic solvent such as toluene, xylene, or anisole. That is, the hole injection layer 3 can be formed by applying the coating solution to the transparent positive electrode 2 through spin coating, inkjet printing, or the like so as to form a coating.

The hole injection layer 3 can also be formed using a conventionally known material, without using the high molecular weight compound according to the present invention. Examples of the conventionally known material include:

a porphyrin compound as typified by copper phthalocyanine;

a star burst triphenylamine derivative;

an arylamine having a structure in which molecules are connected via a single bond or a divalent group that does not have a hetero atom (for example, a triphenylamine trimer or tetramer);

an acceptor-like heterocyclic ring compound such as hexacyanoazatriphenylene; and a coating polymer material such as, for example, poly(3,4-ethylenedioxythiophene) (PEDOT), or poly(styrenesulfonate) (PSS).

A layer (thin film) made of any of the materials listed above can be formed through coating using a deposition method, a spin-coating method, an inkjet printing method, or the like. The same applies to other layers. Film-forming is performed using a deposition method or a coating method according to the type of film-forming material.

As with the hole injection layer 3, the hole transport layer 4 formed on the hole injection layer 3 can also be formed through coating such as spin-coating or inkjet printing using the high molecular weight compound according to the present invention.

Alternatively, the hole transport layer 4 can also be formed using a conventionally known hole transport material. Typical examples of the hole transport material include:

benzidine derivatives such as N,N'-diphenyl-N,N'-di(m-tolyl)benzidine (hereinafter referred to simply as TPD), N,N'-diphenyl-N,N'-di(α-naphthyl)benzidine (hereinafter referred to simply as NPD), and N,N,N',N'-tetrabiphenylyl benzidine;

amine derivatives such as 1,1-bis[4-(di-4-tolylamino)phenyl]cyclohexane (hereinafter referred to simply as TAPC);

various types of triphenylamine trimers and tetramer; and coating polymer materials that are also used to form a hole injection layer.

The compounds for forming a hole transport layer, including the high molecular weight compound according to the present invention, may be used alone or in combination of two or more to form a hole transport layer. Alternatively, a multi-layer film in which a plurality of layers formed using one or more of the compounds listed above are stacked may be used as the hole transport layer.

Alternatively, the hole injection layer 3 and the hole transport layer 4 may be combined into one layer. Such a hole injection/transport layer can be formed through coating using a polymer material such as PEDOT.

In the hole transport layer 4 (the same applies to the hole injection layer 3), a material obtained by p-doping a material usually used to form the layer with trisbromophenylamine-hexachloroantimony, a radialene derivative (see, for example, WO 2014/009310), or the like can also be used. The hole transport layer 4 (or the hole injection layer 3) can also be formed using a polymer compound that has a TPD base backbone, or the like.

Furthermore, the unshown electron blocking layer, which can be formed between the hole transport layer 4 and the light emitting layer 5, can also be formed using a known electron blocking compound that has an electron blocking function. Examples of the known electron blocking compound include a carbazole derivative or a compound having a triphenylsilyl group and a triarylamine structure. Specific examples of the carbazole derivative and the compound having a triarylamine structure are as follows.

Examples of the carbazole derivative include:
4,4',4''-tri(N-carbazolyl)triphenylamine (hereinafter referred to simply as TCTA);
9,9-bis[4-(carbazole-9-yl)phenyl]fluorene;
1,3-bis(carbazole-9-yl)benzene (hereinafter referred to simply as mCP); and
2,2-bis(4-carbazole-9-ylphenyl)adamantane (hereinafter referred to simply as Ad-Cz).

An example of the compound having a triarylamine structure includes 9-[4-(carbazole-9-yl)phenyl]-9-[4-(triphenylsilyl)phenyl]-9H-fluorene.

The electron blocking layer is formed using one or more of the known electron blocking materials listed above. However, a multi-layer film in which a plurality of layers are formed using one or more of the electron blocking materials are stacked may be used as the electron blocking layer.

The light emitting layer 5 of the organic EL element can be formed using a light emitting material such as a metal complex of a quinolinol derivative such as $Alq_3$. Other examples of the light emitting material include various types of metal complexes of zinc, beryllium, aluminum and the like, an anthracene derivative, a bisstyrylbenzene derivative, a pyrene derivative, an oxazole derivative, and a polyphenylene vinylene derivative.

Also, the light emitting layer 5 can also be formed using a host material and a dopant material.

In this case, as the host material, in addition to the light emitting materials listed above, a thiazole derivative, a benzimidazole derivative, a polydialkylfluorene derivative, and the like can be used. Furthermore, the high molecular weight compound according to the present invention described above can also be used.

As the dopant material, quinacridone, coumalin, rubrene, perylene, and derivatives thereof, a benzopyran derivative, a rhodamine derivative, an amino styryl derivative, and the like can be used.

The light emitting layer 5 described above may have a single-layer structure in which one or more of the light emitting materials listed above is used, or a multi-layer structure in which a plurality of layers are stacked.

Furthermore, the light emitting layer 5 can also be formed using a phosphorescent light emitting material as the light emitting material.

As the phosphorescent light emitting material, a phosphorescent emitter of a metal complex such as iridium or platinum can be used. For example, a green phosphorescent emitter such as $Ir(ppy)_3$, a blue phosphorescent emitter such as FIrpic or FIr6, a red phosphorescent emitter such as $Btp_2Ir$(acac), or the like can be used. The phosphorescent light emitting material is used by being doped into a host material that has hole injectionability/transportability or a host material that has electron transportability.

As the host material that has hole injectionability/transportability, a carbazole derivative such as 4,4'-di(N-carbazolyl)biphenyl (hereinafter referred to simply as CBP), TCTA, or mCP, or the like can be used. Furthermore, the high molecular weight compound according to the present invention can also be used.

Also, as the host material that has electron transportability, p-bis(triphenylsilyl)benzene (hereinafter referred to simply as UGH2), 2,2',2''-(1,3,5-phenylene)-tris(1-phenyl-1H-benzimidazole) (hereinafter referred to simply as TPBI), or the like can be used.

In order to avoid concentration quenching, it is preferable to dope the host material with the phosphorescent light emitting material through co-deposition in an amount of 1 to 30 wt % relative to the entire light emitting layer.

Also, as the light emitting material, a material that emits delayed fluorescence such as a CDCB derivative, specifically, PIC-TRZ, CC2TA, PXZ-TRZ, 4CzIPN, or the like can also be used (see Appl. Phys. Let., 98, 083302 (2011)).

The light emitting layer 5 may be formed by causing the high molecular weight compound according to the present invention to be carried by a fluorescent emitter, a phosphorescent emitter or a material that emits delayed fluorescence, the fluorescent emitter and the phosphorescent emitter being called a dopant. In this way, an organic EL element that has a low driving voltage and improved light emission efficiency can be achieved.

The hole blocking layer (not shown in the diagram) formed between the light emitting layer 5 and the electron transport layer 6 can be formed using a conventionally known hole blocking compound.

Examples of the known hole blocking compound include: a phenanthroline derivative such as bathocuproine (hereinafter referred to simply as BCP); a metal complex of a quinolinol derivative such as aluminum (III)bis(2-methyl-8-quinolinate)-4-phenylphenolate (hereinafter referred to simply as BAlq); various types of rare-earth complexes; a triazole derivative; a triazine derivative; and an oxadiazole derivative.

These materials can also be used to form an electron transport layer 6, which will be described below. Furthermore, the hole blocking layer may also be used as the electron transport layer 6.

The hole blocking layer may also have a single or multi-layer stack structure in which each layer is formed using one or more of the hole blocking compounds listed above and the high molecular weight compound according to the present invention.

The electron transport layer 6 is formed using, in addition to the naphthotriazole derivative of the present invention, a conventionally known electron transport compound. Examples of the known electron transport compound include metal complexes of quinolinol derivatives such as $Alq_3$ and BAlq, various types of metal complexes, a triazole derivative, a triazine derivative, an oxadiazole derivative, a thiadiazole derivative, a carbodiimide derivative, a quinoxaline derivative, a phenanthroline derivative, a silole derivative, and the like.

The electron transport layer 6 may also have a single or multi-layer stack structure in which each layer is formed using one or more of the electron transport compounds listed above.

Furthermore, the electron injection layer which is formed optionally (not shown in the diagram) can also be formed using a conventionally known material. Examples of the known material include: alkali metal salts such as lithium fluoride and cesium fluoride; alkaline earth metal salts such as magnesium fluoride; metal oxides such as aluminum oxide; and the like.

The negative electrode 7 of the organic EL element is formed using an electrode material that has a low work function. Examples of the electrode material include aluminum, or an alloy, that has an even lower work function, such as a magnesium-silver alloy, a magnesium-indium alloy, or an aluminum-magnesium alloy is used as the electrode material.

In the present invention, at least one of the hole injection layer 3, the hole transport layer 4, the light emitting layer 5, and the unshown electron blocking layer is formed using the high molecular weight compound including a substituted triarylamine structure represented by the general formula (1)

given above. As a result, an organic EL element that has high light emission efficiency, high power efficiency, a low actual driving voltage, a low light-emission start voltage, and outstanding durability can be obtained. In particular, the organic EL element has a low driving voltage, improved current tolerance, and improved maximum light emission luminance while having high light emission efficiency.

EXAMPLES

Hereinafter, the present invention will be described by way of examples given below.

In the description given below, the structural unit represented by the general formula (1) included in the high molecular weight compound according to the present invention will be referred to as "structural unit A", the structural unit introduced to enhance the solubility in an organic solvent will be referred to as "structural unit B", and the structural unit introduced to enhance thermal crosslinkability will be referred to as "structural unit C".

Also, purification of a synthesized compound was performed through column chromatography or crystallization using a solvent, and identification of the compound was performed through NMR analysis.

In order to produce high molecular weight compounds according to the present invention, the following intermediates 1 to 5 were synthesized.

<Synthesis of Intermediate 1>

[Chem. 4]

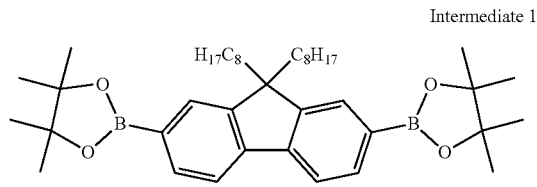

Intermediate 1

The intermediate 1 is a borate ester used to introduce the structural unit B for improving the solubility in an organic solvent.

The following components were placed in a reaction vessel whose internal air was replaced with nitrogen, and nitrogen gas was passed through the reaction vessel for 30 minutes:

15 g of 2,7-dibromo-9,9-di-n-octylfluorene;
15.3 g of bis(pinacolato)diboron;
8.0 g of potassium acetate; and
150 ml of 1,4-dioxane.

Then, 0.67 g of {1,1'-bis(diphenylphosphino) ferrocene}palladium(II)dichloride dichloromethane adduct was added, and the mixture was heated and stirred at 90° C. for 11.5 hours.

After the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude product. The crude product was dispersed in and washed with methanol, and 15.3 g (with a yield of 88%) of a pale yellow powder of intermediate 1 was thereby obtained.

<Synthesis of Intermediate 2>

[Chem. 5]

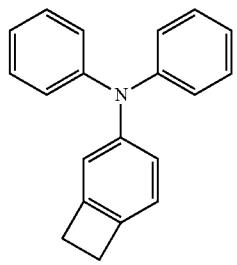

Intermediate 2

The intermediate 2 is a unit compound used to introduce the structural unit C for improving thermal crosslinkability.

The following components were placed in a reaction vessel whose internal air was replaced with nitrogen, and nitrogen gas was passed through the reaction vessel for 30 minutes:

1.8 g of diphenylamine;
2.0 g of 4-bromobenzocyclobuten;
1.5 g of sodium-t-butoxide; and
20 ml of toluene.

Then, 0.05 g of palladium(II) acetate and 0.17 g of tri-t-butylphosphine were added, and the mixture was heated and stirred at 90° C. for 2.5 hours.

After the mixture was cooled down to room temperature, toluene was added, the mixture was filtered, and the filtrate was concentrated under reduced pressure to obtain a crude product. The crude product was purified through column chromatography (n-hexane), and 2.2 g (with a yield of 77%) of a colorless transparent oil of intermediate 2 was thereby obtained.

<Synthesis of Intermediate 3>

[Chem. 6]

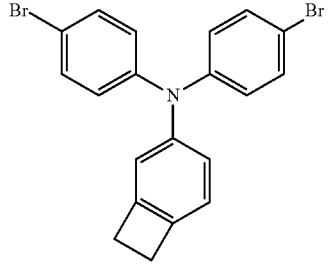

Intermediate 3

The intermediate 3 is a compound obtained by dibromizing the intermediate 2, and is used to polymerize the intermediate 2.

2.1 g of intermediate 2 obtained above and 20 ml of dimethylformamide were placed in a reaction vessel whose internal air was replaced with nitrogen, and the mixture was ice-cooled.

At an internal temperature of 2° C., 2.8 g of N-bromosuccinimide was added, and the mixture was stirred for 5 hours.

Then, water and toluene were added, and a separation operation was performed to extract an organic layer. The organic layer was dehydrated using magnesium sulfate anhydrous, and then concentrated under reduced pressure to obtain a crude product. The crude product was purified through column chromatography (n-hexane), and 2.8 g (with a yield of 84%) of white powder of intermediate 3 was thereby obtained.

<Synthesis of Intermediate 4>

[Chem. 7]

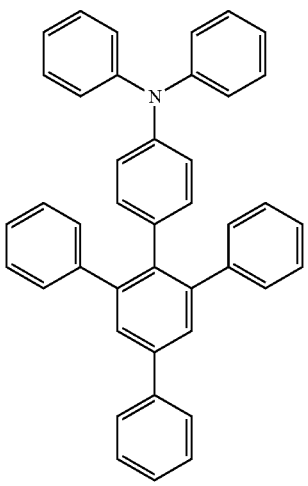

Intermediate 4

The intermediate 4 is a unit compound used to introduce the structural unit A included in the high molecular weight compound according to the present invention.

The following components were placed in a reaction vessel whose internal air was replaced with nitrogen, and nitrogen gas was passed through the reaction vessel for 30 minutes:
- 14.0 g of 2-bromo-1,3,5-triphenylbenzene;
- 11.5 g of 4-(diphenylamino)phenylboronic acid;
- 140 ml of 1,4-dioxane; and
- 37 ml of aqueous solution of 2M-potassium carbonate.

Then, 1.26 g of tetrakis(triphenylphosphine)palladium was added, and the mixture was heated and stirred at 85° C. for 6.5 hours.

After the mixture was cooled down to room temperature, the mixture was filtered to extract a precipitated solid. The obtained solid was dissolved in tetrahydrofuran, and the mixture was filtered. The filtrate was concentrated under reduced pressure, and then crystallized and purified by adding methanol to obtain 18.1 g (with a yield of 91%) of a whitish powder of intermediate 4.

<Synthesis of Intermediate 5>

[Chem. 8]

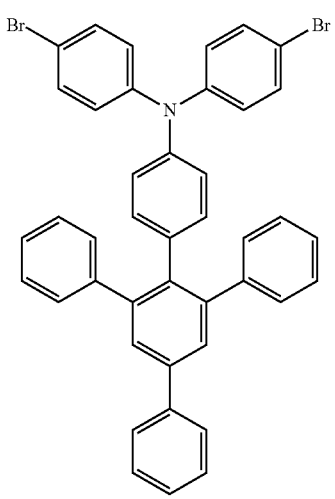

Intermediate 5

The intermediate 5 is a compound obtained by dibromizing the intermediate 4, and is used to polymerize the intermediate 4 that is a unit compound for introducing the structural unit A.

18.0 g of intermediate 4 synthesized above and 650 ml of tetrahydrofuran were placed in a reaction vessel whose internal air was replaced with nitrogen. Then, at room temperature, 11.6 g of N-bromosuccinimide was added, and the mixture was stirred for 5 hours.

Then, 500 ml of water was added, and the mixture was filtered to extract a precipitated solid. The obtained solid was washed with methanol to obtain 22.8 g (with a yield of 99%) of a white powder of intermediate 5.

Example 1

Synthesis of High Molecular Weight Compound A

The following components were placed in a reaction vessel whose internal air was replaced with nitrogen, and nitrogen gas was passed through the reaction vessel for 30 minutes:
- 15.0 g of intermediate 1;
- 2.0 g of intermediate 3;
- 13.2 g of intermediate 5;
- 20.8 g of tripotassium phosphate;
- 60 ml of toluene;
- 33 ml of water; and
- 180 ml of 1,4-dioxane.

Then, 5.0 mg of palladium(II) acetate and 40.5 mg of tri-o-tolylphosphine were added, and the mixture was heated and stirred at 80° C. for 7 hours.

Then, 0.27 g of intermediate 1 was added and the mixture was stirred for 1 hour, and then 0.73 g of bromobenzene was added and the mixture was stirred for 1 hour.

After the mixture was cooled down to room temperature, 500 ml of toluene and 200 ml of 5 wt % aqueous solution of N,N-sodium diethyldithiocarbamate were added, and the mixture was stirred under reflux for 2 hours.

Then, the mixture was cooled down to room temperature, a saturated saline solution and toluene were added, and a separation operation was performed to extract an organic layer. The organic layer was dehydrated using magnesium sulfate anhydrous, and then concentrated under reduced pressure to obtain a crude polymer. The crude polymer was dissolved in toluene and purified by being passed through a silica gel column. The obtained solution was concentrated under reduced pressure, 500 ml of tetrahydrofuran was added to a dried solid to dissolve the dried solid, and the resultant was dripped into 1000 ml of ice-cooled methanol, and the mixture was stirred. Then, a precipitate was obtained through filtering, and dried to obtain 19.7 g of high molecular weight compound A.

Figure 23:
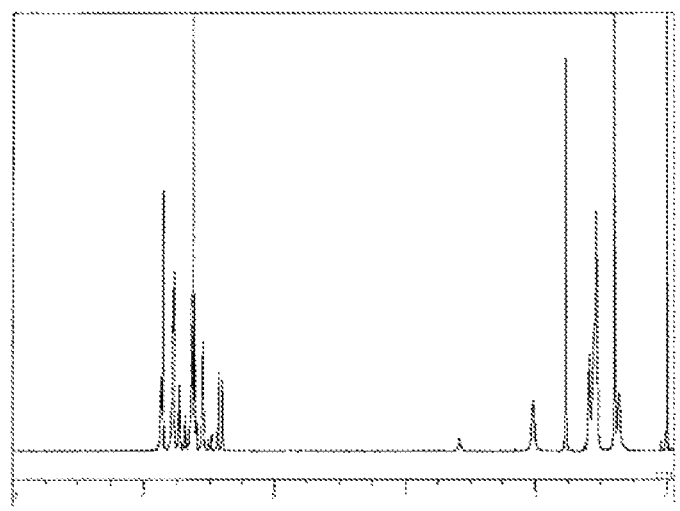
FIG. 23 is a diagram showing a $^1$H-NMR chart of a high molecular weight compound (high molecular weight compound A) according to the present invention synthesized in Example 1.

The obtained pale yellow powder was subjected to NMR measurement. FIG. 23 shows the result of $^1$H-NMR measurement.

The average molecular weight measured using GPC, the degree of dispersion, and the chemical composition of the high molecular weight compound were as follows.

Number average molecular weight Mn (on a polystyrene basis): 62,000

Weight average molecular weight Mw (on a polystyrene basis): 456,000;

Degree of dispersion (Mw/Mn): 7.4

Chemical composition:

[Chem. 9]

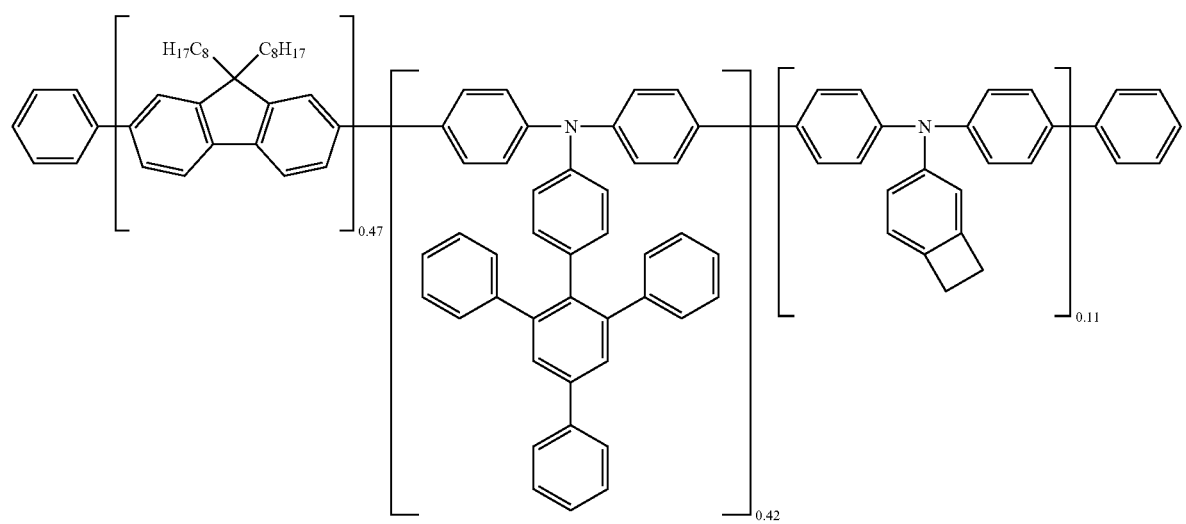

(High Molecular Weight Compound A)

As can be understood from the chemical composition given above, the high molecular weight compound A contained 42 mol % of structural unit A represented by the general formula (1), and 47 mol % of structural unit B for improving the solubility in an organic solvent, and 11 mol % of structural unit C for improving thermal crosslinkability.

Example 2

A deposition film having a thickness of 100 nm was formed on an ITO substrate using the high molecular weight compound A synthesized in Example 1, and work function was measured using an ionization potential measurement apparatus (Model PYS-202 available from Sumitomo Heavy Industries, Ltd.). The result was as follows.

| | Work function |
|---|---|
| High molecular weight compound A (polymer) | 5.63 eV |

The high molecular weight compound A according to the present invention exhibited an energy level higher than 5.4 eV that is the work function of ordinary hole transport materials such as NPD and TPD, from which it can be seen that the high molecular weight compound A has good hole transport capability.

Example 3

Production and Evaluation of Organic EL Element

Figure 22:
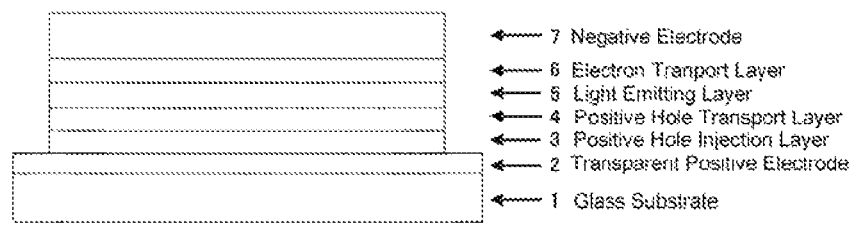
FIG. 22 is a diagram showing an example of a layer configuration of an organic element according to the present invention.

An organic EL element having a layer structure shown in FIG. 22 was produced in the following manner.

A glass substrate 1 on which an ITO film (transparent positive electrode 2) having a thickness of 50 nm was formed was washed with an organic solvent, and then UV/ozone treatment was performed to wash the surface of the ITO film.

A compound having the following structural formula (AQ-1200 available from Solvay) was applied using a spin coating method so as to cover the transparent positive electrode 2 (ITO film) formed on the glass substrate 1, and a 55 nm thick film was thereby formed. The film was dried on a hot plate at 170° C. for 10 minutes, and a hole injection layer 3 was thereby formed.

[Chem. 10]

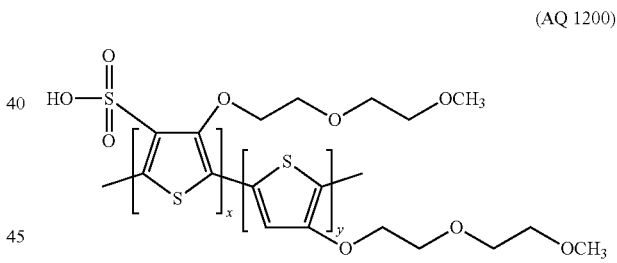

(AQ 1200)

A coating solution was prepared by dissolving the high molecular weight compound A obtained in Example 1 in anisole at a concentration of 0.8 wt %.

The substrate on which the hole injection layer 3 was formed in the manner described above was placed in a glove box whose internal air was replaced with dry nitrogen, and a coating layer having a thickness of 20 nm was formed on the hole injection layer 3 through spin coating using the coating solution described above, and dried on a hot plate at 200° C. for 10 minutes, and a hole transport layer 4 was thereby formed.

The substrate on which the hole transport layer 4 was formed in the manner described above was set in a vacuum deposition apparatus, and the pressure was reduced to 0.001 Pa or less.

A light emitting layer 5 having a thickness of 40 nm was formed on the hole transport layer 4 through dual deposition using SBD 2460 (EMD-1) available from SFC and ABH 401 (EMH-1) available from SFC.

In the dual deposition, the ratio of deposition rate was set to EMD-1:EMH-1=5:95.

Compounds (ETM-1) and (ETM-2) represented by the following structural formulas were prepared as the electron transport materials.

[Chem. 11]

(ETM-1)

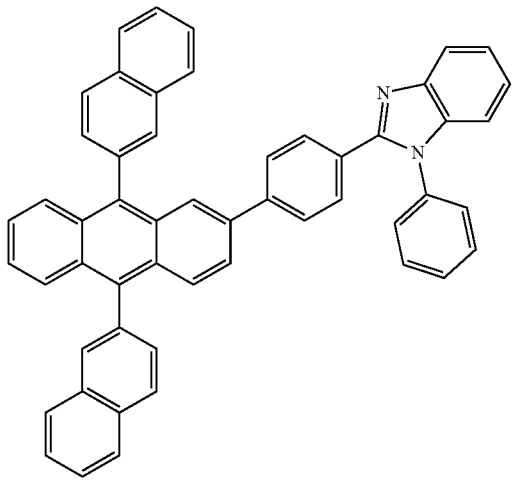

[Chem. 12]

(ETM-2)

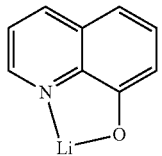

An electron transport layer 6 having a thickness of 20 nm was formed on the light emitting layer 5 formed above through dual deposition using the electron transport materials (ETM-1) and (ETM-2).

The dual deposition was performed at such a rate that the ratio of deposition rate was ETM-1:ETM-2=50:50.

Finally, aluminum was deposited so as to form a film having a thickness of 100 nm, and a negative electrode 7 was thereby formed.

The glass substrate on which the transparent positive electrode 2, the hole injection layer 3, the hole transport layer 4, the light emitting layer 5, the electron transport layer 6, and the negative electrode 7 were formed was placed in a glove box whose internal air was replaced with dry nitrogen, and another glass substrate for sealing was bonded using a UV curable resin, and an organic EL element was thereby produced. The characteristics of the produced organic EL element were measured in an atmosphere at room temperature.

Also, light emission characteristics were measured by applying a DC voltage to the produced organic EL element.

The measurement results are shown in Table 1.

Example 4

An organic EL element was produced in the same manner as in Example 3, except that the hole transport layer 4 was formed by changing the coating solution of high molecular weight compound A used to form the hole transport layer 4 in Example 3 to a coating solution prepared by dissolving the high molecular weight compound A in toluene at a concentration of 0.6 wt %, forming a coating layer having a thickness of 20 nm through spin coating using the coating solution, and drying the coating layer on a hot plate at 200° C. for 10 minutes and then at 150° C. for 1 hour.

The organic EL element was subjected to evaluation for various characteristics as in Example 3. The results are shown in Table 1.

Example 5

An organic EL element was produced in the same manner as in Example 3, except that the hole transport layer 4 was formed by changing the coating solution of high molecular weight compound A used to form the hole transport layer 4 in Example 3 to a coating solution prepared by dissolving the high molecular weight compound A in o-xylene at a concentration of 0.8 wt %, forming a coating layer having a thickness of 20 nm through spin coating using the coating solution, and drying the coating layer on a hot plate at 200° C. for 10 minutes and then at 160° C. for 1 hour.

Various characteristics of the organic EL element were evaluated as in Example 3. The results are shown in Table 1.

Comparative Example 1

An organic EL element was produced in exactly the same manner as in Example 3, except that the hole transport layer 4 was formed using a coating solution prepared by dissolving, instead of high molecular weight compound A, TFB (hole transport polymer) shown below in anisole at a concentration of 0.8 wt %.

[Chem.13]

(TFB)

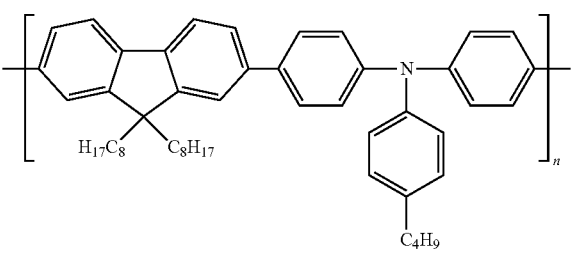

Poly[(9,9-dioctylfluorenyl-2,7-diyl)-co-(4,4'-(N-(4-sec-butylphenyl))diphenylamine] (Hole Transport Polymer ADS259BE available from American Dye Source)

Various characteristics of the organic EL element were evaluated as in Example 3. The results are shown in Table 1.

Comparative Example 2

An organic EL element was produced in exactly the same manner as in Example 4, except that the hole transport layer 4 was formed using a coating solution prepared by dissolving, instead of high molecular weight compound A, TFB (hole transport polymer) shown above in toluene at a concentration of 0.6 wt %.

Various characteristics of the organic EL element were evaluated as in Examples 3 and 4. The results are shown in Table 1.

Comparative Example 3

An organic EL element was produced in exactly the same manner as in Example 5, except that the hole transport layer 4 was formed using a coating solution prepared by dissolving, instead of high molecular weight compound A, TFB (hole transport polymer) shown above in o-xylene at a concentration of 0.8 wt %.

Various characteristics of the organic EL element were evaluated as in Examples 3 to 5. The results are shown in Table 1.

In the evaluation of various characteristics, element lifespan is defined as the time taken for light emission luminance to decay to 490 cd/m² (corresponding to 70% of the initial luminance being set to 100%: at a decay of 70%) when constant current driving is performed, with the light emission luminance (initial luminance) when light emission starts being set to 700 cd/m².

The obtained film was placed in a glove box whose internal air was replaced with dry nitrogen, and baked on a hot plate at 200° C. for 1 hour or 230° C. for 10 minutes.

After the baked film was cooled down to room temperature, absorption intensity of light at a wavelength of 300 to 700 nm was measured using a spectrophotometer (U-3000 available from Hitachi, Ltd.).

Also, the film that has undergone absorption intensity measurement was rinsed with toluene using a spin coater at 2000 rpm for 15 seconds. The absorption intensity of the rinsed film was measured using a spectrophotometer (U-3000 available from Hitachi, Ltd.).

Residual film ratio was calculated, using the following equation, from the absorption intensity values before and after rinsing measured in the manner described above. The results are shown in Table 2.

Residual film ratio (%)=($\alpha/\beta$)×100,

TABLE 1

| | Compound | Solvent | Voltage [V] (@ 10 mA/cm²) | Luminance [cd/m²] (@ 10 mA/cm²) | Light emission efficiency [cd/A] (@ 10 mA/cm²) | Power efficiency [lm/W] (@ 10 mA/cm²) | Element lifespan at a decay of 70% [hr] (@ 700 cd/m²) |
|---|---|---|---|---|---|---|---|
| Example 3 | High molecular | Anisole | 4.81 | 644 | 6.44 | 4.20 | 436 |
| Example 4 | weight | Toluene | 4.23 | 763 | 7.63 | 5.66 | 866 |
| Example 5 | compound A | o-Xylene | 4.06 | 725 | 7.25 | 5.61 | 745 |
| Comparative Example 1 | TFB | Anisole | 4.56 | 410 | 4.10 | 2.83 | 76 |
| Comparative Example 2 | | Toluene | 4.41 | 542 | 5.42 | 3.87 | 114 |
| Comparative Example 3 | | o-Xylene | 4.20 | 504 | 5.04 | 3.77 | 132 |

As shown in Table 1, the light emission efficiency at an electric current density of 10 mA/cm² was 6.44 cd/A in Example 3 relative to 4.10 cd/A in Comparative Example 1, 7.63 cd/A in Example 4 relative to 5.42 cd/A in Comparative Example 2, and 7.25 cd/A in Example 5 relative to 5.04 cd/A in Comparative Example 3. When a comparison is made between an example and a comparative example in which the same organic solvent was used, all of the organic EL elements in which the hole transport layer 4 was formed using the high molecular weight compound A according to the present invention exhibited high efficiency.

Also, the element lifespan (at a decay of 70%) was 436 hours in Example 3 relative to 76 hours in Comparative Example 1, 866 hours in Example 4 relative to 114 hours in Comparative Example 2, and 745 hours in Example 5 relative to 132 hours in Comparative Example 3. When a comparison is made between an example and a comparative example in which the same solvent was used, all of the organic EL elements in which the high molecular weight compound A according to the present invention was used exhibited a long lifespan.

As can be seen from the foregoing, an organic EL element including an organic layer formed using the high molecular weight compound according to the present invention can have higher light emission efficiency and a longer lifespan as compared with a conventional organic EL element.

Example 6

Measurement and Evaluation of Residual Film Ratio

A thin film was formed on a glass substrate through spin coating using a solution prepared by dissolving the high molecular weight compound A synthesized in Example 1 in toluene at a concentration of 0.6 wt %.

wherein $\alpha$ represents the absorption intensity (peak top) after rinsing, and $\beta$ represents the absorption intensity (peak top) before rinsing.

Comparative Example 4

The residual film ratio was calculated in the same manner as in Example 6, except that the high molecular weight compound A was changed to TFB used in Comparative Examples 1 to 3. The result is shown in Table 2.

TABLE 2

| | Compound | Residual film ratio Baked at 200 C.° for 60 min. | Residual film ratio Baked at 230 C.° for 10 min. |
|---|---|---|---|
| Example 6 | High molecular weight compound A | 95.7% | 99.3% |
| Comparative Example 4 | TFB | 28.9% | 33.6% |

As shown in Table 2, the high molecular weight compound A exhibited a residual film ratio of 95.7% when baked at 200° C. for 60 minutes and 99.3% when baked at 230° C. for 10 minutes, from which it can be seen that the high molecular weight compound according to the present invention has a high level of curability (thermal crosslinkability).

INDUSTRIAL APPLICABILITY

The high molecular weight compound according to the present invention has high hole transport capability, excel-

The invention claimed is:

1. A high molecular weight compound comprising a substituted triarylamine structural unit represented by the following general formula (1); and a structural unit including a group having at least one aromatic hydrocarbon ring or including a triarylamine backbone;

[Chem. 1]

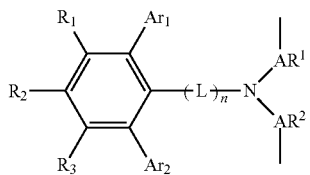

(1)

wherein $AR^1$, $AR^2$, and L each independently represent a divalent aromatic hydrocarbon group or a divalent aromatic heterocyclic group,
n is an integer of 1 to 3,
$Ar_1$ and $Ar_2$ each independently represent an aryl group or a heteroaryl group,
$R_1$, $R_2$, and $R_3$ each independently represent a hydrogen atom, a heavy hydrogen atom, a fluorine atom, a chlorine atom, a cyano group, a nitro group, an alkyl group having 1 to 6 carbon atoms, an alkyloxy group having 1 to 6 carbon atoms, a cycloalkyl group having 5 to 10 carbon atoms, a cycloalkyloxy group having 5 to 10 carbon atoms, an alkenyl group having 2 to 6 carbon atoms, an aryl group, an aryloxy group, or a heteroaryl group, and $R_1$, $R_2$, and $R_3$ are not simultaneously aryl groups.

2. The high molecular weight compound according to claim 1, comprising a repeating unit including the structural unit, and having a weight average molecular weight on a polystyrene basis of 10,000 or more and less than 1,000,000.

3. The high molecular weight compound according to claim 1,
wherein, in the general formula (1), $Ar_1$ and $Ar_2$ each independently represent an aryl group.

4. The high molecular weight compound according to claim 3,
wherein $Ar_1$ and $Ar_2$ each independently represent: an aryl group having no substituent group; or an aryl group substituted with a phenyl group.

5. The high molecular weight compound according to claim 4,
wherein $Ar_1$ and $Ar_2$ represent a phenyl group, a biphenylyl group, a naphthyl group, a phenanthrenyl group, or a fluorenyl group.

6. The high molecular weight compound according to claim 1,
wherein, in the general formula (1), $R_1$ and $R_3$ each independently represent a hydrogen atom or a heavy hydrogen atom.

7. The high molecular weight compound according to claim 1,
wherein, in the general formula (1), L represents a phenylene group.

8. The high molecular weight compound according to claim 7,
wherein L represents a 1,4-phenylene group.

9. An organic EL element comprising: a pair of electrodes; and at least one organic layer located between the pair of electrodes,
wherein the organic layer contains the high molecular weight compound according to claim 1.

10. The organic EL element according to claim 9, wherein the organic layer is a hole transport layer.

11. The organic EL element according to claim 9, wherein the organic layer is an electron blocking layer.

12. The organic EL element according to claim 9, wherein the organic layer is a hole injection layer.

13. The organic EL element according to claim 9, wherein the organic layer is a light emitting layer.

* * * * *